US00RE49913E

(19) United States
(12) Reissued Patent
Pala et al.

(10) Patent Number: US RE49,913 E
(45) Date of Reissued Patent: *Apr. 9, 2024

(54) VERTICAL POWER TRANSISTOR DEVICE

(71) Applicant: Wolfspeed, Inc., Durham, NC (US)

(72) Inventors: Vipindas Pala, San Jose, CA (US); Anant Kumar Agarwal, Chapel Hill, NC (US); Lin Cheng, Chapel Hill, NC (US); Daniel Jenner Lichtenwalner, Raleigh, NC (US); John Williams Palmour, Cary, NC (US)

(73) Assignee: Wolfspeed, Inc., Durham, NC (US)

( * ) Notice: This patent is subject to a terminal disclaimer.

(21) Appl. No.: 17/080,062

(22) Filed: Oct. 26, 2020

Related U.S. Patent Documents

Reissue of:
(64) Patent No.: 9,331,197
Issued: May 3, 2016
Appl. No.: 13/962,295
Filed: Aug. 8, 2013

U.S. Applications:
(63) Continuation of application No. 15/970,148, filed on May 3, 2018, now Pat. No. Re. 48,380, which is an application for the reissue of Pat. No. 9,331,197.

(51) Int. Cl.
*H01L 27/108* (2006.01)
*H01L 21/337* (2006.01)
(Continued)

(52) U.S. Cl.
CPC ..... *H01L 29/0684* (2013.01); *H01L 29/0865* (2013.01); *H01L 29/0878* (2013.01);
(Continued)

(58) Field of Classification Search
CPC ..... H01L 29/7827; H01L 29/0878; H01L 29/1095; H01L 29/7802; H01L 29/1608
See application file for complete search history.

(56) References Cited

U.S. PATENT DOCUMENTS 4,126,900 A * 11/1978 Koomen ..... G11C 11/35 257/261
4,803,533 A 2/1989 Chang et al.
(Continued)

FOREIGN PATENT DOCUMENTS

CN 1729577 A 2/2006
EP 0748520 A1 12/1996
(Continued)

OTHER PUBLICATIONS

Agarwal, A. et al., "A New Degradation Mechanism in High-Voltage SiC Power MOSFETs," IEEE Electron Device Letters, vol. 28, No. 7, Jul. 2007, pp. 587-589.
(Continued)

*Primary Examiner* — Tuan H Nguyen
(74) *Attorney, Agent, or Firm* — Myers Bigel, P.A.

(57) ABSTRACT

A power metal-oxide-semiconductor field-effect transistor (MOSFET) includes a substrate, a drift layer over the substrate, and a spreading layer over the drift layer. The spreading layer includes a pair of junction implants separated by a junction gate field effect (JFET) region. A gate oxide layer is on top of the spreading layer. The gate contact is on top of the gate oxide layer. Each one of the source contacts are on a portion of the spreading layer separate from the gate oxide layer and the gate contact. The drain contact is on the surface of the substrate opposite the drift layer.

13 Claims, 17 Drawing Sheets

(51) Int. Cl.

| | |
|---|---|
| ***H01L 21/8238*** | (2006.01) |
| ***H01L 29/06*** | (2006.01) |
| ***H01L 29/08*** | (2006.01) |
| ***H01L 29/10*** | (2006.01) |
| ***H01L 29/16*** | (2006.01) |
| ***H01L 29/66*** | (2006.01) |
| ***H01L 29/78*** | (2006.01) |
| ***H01L 29/94*** | (2006.01) |

(52) U.S. Cl.

CPC ..... *H01L 29/0882* (2013.01); *H01L 29/1095* (2013.01); *H01L 29/1608* (2013.01); *H01L 29/7802* (2013.01); *H01L 29/7827* (2013.01)

(56) References Cited

U.S. PATENT DOCUMENTS 4,967,243 A 10/1990 Baliga et al.
5,111,253 A 5/1992 Korman et al.
5,241,195 A 8/1993 Tu et al.
5,365,102 A 11/1994 Mehrotra et al.
5,378,911 A 1/1995 Murakami
5,536,977 A 7/1996 Williams
5,661,314 A 8/1997 Merrill et al.
5,674,766 A 10/1997 Darwish et al.
5,689,144 A 11/1997 Williams
5,886,383 A 3/1999 Kinzer
5,973,367 A 10/1999 Williams
6,057,558 A 5/2000 Yamamoto et al.
6,239,463 B1 5/2001 Williams et al.
6,700,175 B1 3/2004 Kodama et al.
6,979,863 B2 12/2005 Ryu
7,221,010 B2 * 5/2007 Ryu ..... H01L 21/8213 257/256
7,498,633 B2 * 3/2009 Cooper ..... H01L 29/0696 257/256
7,592,647 B2 9/2009 Nakata et al.
7,923,320 B2 * 4/2011 Ryu ..... H01L 21/8213 257/302
8,178,920 B2 * 5/2012 Nakamura ..... H01L 29/0649 257/330
8,283,973 B2 10/2012 Hashimoto et al.
8,415,671 B2 * 4/2013 Zhang ..... H01L 29/0623 257/66
8,492,827 B2 * 7/2013 Ryu ..... H01L 21/8213 257/328
8,575,692 B2 11/2013 Yang et al.
8,686,439 B2 4/2014 Takahashi et al.
9,318,597 B2 4/2016 Pala et al.
9,331,197 B2 5/2016 Pala et al.
9,741,842 B2 8/2017 Pala et al.
10,192,960 B2 1/2019 Wada et al.
2002/0038891 A1 4/2002 Ryu et al.
2002/0047124 A1 4/2002 Kitabatake
2002/0125541 A1 9/2002 Korec et al.
2003/0006452 A1 1/2003 Challa
2003/0040144 A1 2/2003 Blanchard et al.
2003/0080355 A1 5/2003 Shirai et al.
2003/0178672 A1 9/2003 Hatakeyama et al.
2003/0214011 A1 11/2003 Jianjun et al.
2004/0099905 A1 5/2004 Baliga
2004/0195618 A1 10/2004 Saito et al.
2004/0212011 A1 10/2004 Ryu
2004/0251503 A1 12/2004 Hayashi et al.
2005/0035398 A1 2/2005 Williams et al.
2005/0045960 A1 3/2005 Takahashi
2005/0082611 A1 4/2005 Peake et al.
2005/0253190 A1 * 11/2005 Okumura ..... H01L 29/7813 257/330
2006/0192256 A1 8/2006 Cooper et al.
2006/0202264 A1 9/2006 Bhalla et al.
2006/0214221 A1 9/2006 Challa et al.
2007/0012983 A1 1/2007 Yang et al.
2007/0034901 A1 2/2007 Lui et al.
2007/0045655 A1 3/2007 Song et al.
2007/0096237 A1 5/2007 Zhao et al.
2007/0120201 A1 5/2007 Yamaguchi et al.
2007/0145414 A1 6/2007 Francis et al.
2007/0235745 A1 10/2007 Hayashi et al.
2008/0012026 A1 1/2008 Tsuji
2008/0029812 A1 2/2008 Bhalla
2008/0050876 A1 2/2008 Matocha et al.
2008/0105949 A1 5/2008 Zhang et al.
2008/0128850 A1 6/2008 Goerlach et al.
2008/0142811 A1 * 6/2008 Matocha ..... H01L 29/0878 257/77
2008/0149963 A1 6/2008 Adan
2008/0197439 A1 8/2008 Goerlach et al.
2008/0206941 A1 8/2008 Okuno et al.
2008/0230787 A1 9/2008 Suzuki et al.
2008/0308838 A1 12/2008 McNutt et al.
2009/0057757 A1 3/2009 Hokomoto et al.
2009/0065814 A1 3/2009 Bhalla et al.
2009/0072242 A1 3/2009 Zhang
2009/0078971 A1 3/2009 Treu et al.
2009/0079001 A1 3/2009 Salih et al.
2009/0090920 A1 4/2009 Endo et al.
2009/0146154 A1 6/2009 Zhang et al.
2009/0173949 A1 7/2009 Yatsuo et al.
2009/0179297 A1 7/2009 Stewart et al.
2009/0189228 A1 7/2009 Zhang et al.
2009/0218621 A1 9/2009 Pfirsch et al.
2009/0236612 A1 9/2009 Nakamura et al.
2009/0272983 A1 11/2009 Kumar et al.
2009/0278197 A1 11/2009 Ohta et al.
2009/0283776 A1 11/2009 Iwamuro
2009/0283798 A1 11/2009 Tsuzuki et al.
2010/0013007 A1 1/2010 Miyakoshi
2010/0025693 A1 2/2010 Malhan et al.
2010/0073039 A1 3/2010 Kanai et al.
2010/0078710 A1 4/2010 Willmeroth et al.
2010/0093116 A1 4/2010 Fronheiser et al.
2010/0176443 A1 7/2010 Takaishi
2010/0219417 A1 9/2010 Miura et al.
2010/0270586 A1 10/2010 Ueno
2011/0049564 A1 3/2011 Guan et al.
2011/0156810 A1 6/2011 Girdhar et al.
2011/0193057 A1 * 8/2011 Sabathil ..... H01L 33/04 257/13
2011/0241068 A1 10/2011 Watanabe et al.
2011/0254088 A1 10/2011 Darwish et al.
2012/0025874 A1 2/2012 Saikaku et al.
2012/0037955 A1 2/2012 Hirler et al.
2012/0088339 A1 * 4/2012 Molin ..... H01L 21/823487 438/138
2012/0187419 A1 7/2012 Elpelt et al.
2012/0236615 A1 9/2012 Kitabatake
2012/0256195 A1 10/2012 Aketa
2012/0280258 A1 * 11/2012 Yeh ..... H01L 33/007 257/88
2012/0292742 A1 11/2012 Itoh et al.
2012/0306009 A1 12/2012 Kim
2012/0313212 A1 12/2012 Sugawara
2013/0026493 A1 1/2013 Cheng et al.
2013/0026568 A1 1/2013 Bhalla
2013/0105889 A1 5/2013 Fujiwara et al.
2013/0153995 A1 6/2013 Misawa et al.
2013/0306983 A1 11/2013 Nakano et al.
2013/0313635 A1 11/2013 Nakano
2013/0341674 A1 12/2013 Werber et al.
2014/0021484 A1 1/2014 Siemieniec et al.
2014/0027781 A1 1/2014 Ryu
2014/0048847 A1 2/2014 Yamashita et al.
2014/0070268 A1 * 3/2014 Yoshimura ..... H01L 29/0834 257/139
2014/0077311 A1 * 3/2014 Simin ..... H01L 29/66446 257/401
2014/0117376 A1 5/2014 Terano et al.
2014/0203299 A1 7/2014 Aketa et al.
2014/0252554 A1 9/2014 Liao
2015/0041886 A1 2/2015 Pala et al.
2015/0053920 A1 * 2/2015 Yeh ..... H01L 33/14 257/13

(56) References Cited

U.S. PATENT DOCUMENTS

| | | | |
|---|---|---|---|
| 2015/0084062 | A1 | 3/2015 | Pala et al. |
| 2015/0084063 | A1 | 3/2015 | Van Brunt et al. |
| 2015/0084118 | A1 | 3/2015 | Van Brunt et al. |
| 2015/0084119 | A1 | 3/2015 | Pala et al. |
| 2015/0084125 | A1 | 3/2015 | Pala et al. |
| 2016/0211360 | A1 | 7/2016 | Pala et al. |

FOREIGN PATENT DOCUMENTS

| | | | |
|---|---|---|---|
| EP | 0867943 | A1 | 9/1998 |
| EP | 1576672 | A2 | 9/2005 |
| FR | 2814855 | A1 | 4/2005 |
| JP | S5742164 | A | 3/1982 |
| JP | S6149474 | A | 3/1986 |
| JP | H065867 | A | 1/1994 |
| JP | 2007184434 | A | 7/2007 |
| JP | 2012114104 | A | 6/2012 |
| JP | 2013149837 | A | 8/2013 |
| KR | 101020344 | B1 | 3/2011 |
| TW | 330894 | B | 9/2010 |
| TW | I330894 | B | 9/2010 |
| WO | 2012137914 | A1 | 10/2012 |
| WO | 2013014943 | A2 | 1/2013 |

OTHER PUBLICATIONS

Author Unknown, "The Industry's First SiC Power MOSFET with Internal SiC SBD Significantly Reduces Power Loss in Inverters and Requires Fewer Components," ROHM Semiconductor Website—Press Releases, Jul. 11, 2012, 3 pages, http://www.rohm.com/web/global/news-detail?news-title=the-industry-s-first%E2%80%BB-sic-power-mosfet-with-internal-sic-sbd&defaultGroupId=false.

Author Unknown, "NextPowerS3 MOSFETs Offer Super-Fast Switching with Soft Recovery," PowerPulse.Net, Copyright: 2013, 3 pages, www.powerpulse.net/story.php?storyID=28455;s=091820131.

Baliga, B. Jayant, "Advanced Power Rectifier Concepts," First Edition, 2009, Springer Science + Business Media, LLC, pp. 29 and 72.

Baliga, B. Jayant, "Chapter 8: Integral Diode," Advanced Power MOSFET Concepts, Copyright: 2010, pp. 399-476, Springer Science+Business Media, LLC, London, England.

Baliga, B. Jayant, "Advanced Power MOSFET Concepts," 2010, Springer Science + Business Media, LLC, Chapters 2, 3, and 8, pp. 23-117, 399-476.

Baliga, B. Jayant, "Fundamentals of Power Semiconductor Devices," Second Edition, 2008 Springer US, p. 168.

Bhatnagar, M. et al., "Effect of Surface Inhomogeneities on the Electrical Characteristics of SiC Schottky Contacts," IEEE Trans. Electron Devices, vol. 43, No. 1, Jan. 1996, pp. 150-156.

Jang, T. et al., "Electrical Characteristics of Tantalum and Tantalum Carbide Schottky Diodes on n- and p-type Silicon Carbide as a Function of Temperature," Presented at the High Temperature Electronics Conference, Jun. 14-18, 1998, Albuquerque, NM, IEEE, pp. 280-286.

Sheng, K. et al., "A Vertical SiC JFET with Monolithically Integrated JBS Diode," 21st International Symposium on Power Semiconductor Devices & IC's (ISPSD), Jun. 14-18, 2009, IEEE, pp. 255-258.

Sui, Y., et al., "On-State Characteristics of SiC power UMOSFETs on 115- μm drift Layers," Electron Device Letters, vol. 26, Issue 4, Apr. 2005, IEEE, pp. 255-257.

Zhu Lin et al., "Analytical Modeling of High-Voltage 4H-SiC Junction Barrier Schottky (JBS) Rectifiers," IEEE Transactions on Electron Devices, vol. 55, Issue 8, Aug. 8, 2008, IEEE, pp. 1857-1863.

Tsuji et. al. "On-stae Characteristics of SiC Power UMOSFETs on 115-micrometer Drift Layers" Apr. 2005, IEEE Electron Device Letters vol. 26, No. 4.*

Wang, S.R. et al., "Double-Self-Aligned Short-Channel Power DMOSFETs in 4H-SiC," Device Research Conference, Jun. 22-24, 2009, University Park, PA, IEEE, pp. 277-278.

International Search Report and Written Opinion for PCT/US2014/049941, mailed Oct. 22, 2014, 12 pages.

Office Action and Search Report for Taiwanese Patent Application No. 103127134, mailed Oct. 22, 2015, 15 pages.

Decision of Allowance for Taiwanese Patent Application No. 103127134, mailed Feb. 26, 2016, 10 pages.

International Preliminary Report on Patentability for PCT/US2014/049941, mailed Feb. 18, 2016, 8 pages.

* cited by examiner

VERTICAL POWER TRANSISTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a continuation reissue of application Ser. No. 15/970,148, which is an application for reissue of U.S. Pat. No. 9,331,197.*

FIELD OF THE DISCLOSURE

The present disclosure relates to power transistor devices, and in particular to power metal-oxide-semiconductor field-effect transistor (MOSFET) devices.

BACKGROUND

A power metal-oxide-semiconductor field-effect transistor (MOSFET) is a type of transistor that is adapted for use in high power applications. Generally, a power MOSFET device has a vertical structure, wherein a source and gate contact are located on a first surface of the MOSFET device that is separated from a drain contact by a drift layer formed on a substrate. Vertical MOSFETS are sometimes referred to as vertical diffused MOSFETs (VDMOSFETs) or double-diffused MOSFETs (DMOSFETs). Due to their vertical structure, the voltage rating of a power MOSFET is a function of the doping and thickness of the drift layer. Accordingly, high voltage power MOSFETs may be achieved with a relatively small footprint.

FIG. 1 shows a conventional power MOSFET device 10. The conventional power MOSFET device 10 includes a substrate 12, a drift layer 14 formed over the substrate 12, one or more junction implants 16 in the surface of the drift layer 14 opposite the substrate, and a junction gate field effect transistor (JFET) region 18 between each one of the junction implants 16. Each one of the junction implants 16 is formed by an ion implantation process, and includes a deep well region 20, a base region 22, and a source region 24. Each deep well region 20 extends from a corner of the drift layer 14 opposite the substrate 12 downwards towards the substrate 12 and inwards towards the center of the drift layer 14. The deep well region 20 may be formed uniformly or include one or more protruding regions, as shown in FIG. 1. Each base region 22 is formed vertically from the surface of the drift layer 14 opposite the substrate 12 down towards the substrate 12 along a portion of the inner edge of each one of the deep well regions 20. Each source region 24 is formed in a shallow portion on the surface of the drift layer 14 opposite the substrate 12, and extends laterally to overlap a portion of the deep well region 20 and the base region 22, without extending over either. The JFET region 18 defines a channel width 26 between each one of the junction implants 16.

A gate oxide layer 28 is positioned on the surface of the drift layer 14 opposite the substrate 12, and extends laterally between a portion of the surface of each source region 24, such that the gate oxide layer 28 partially overlaps and runs between the surface of each source region 24 in the junction implants 16. A gate contact 30 is positioned on top of the gate oxide layer 28. Two source contacts 32 are each positioned on the surface of the drift layer 14 opposite the substrate 12 such that each one of the source contacts 32 partially overlaps both the source region 24 and the deep well region 20 of one of the junction implants 16, respectively, and does not contact the gate oxide layer 28 or the gate contact 30. A drain contact 34 is located on the surface of the substrate 12 opposite the drift layer 14.

In operation, when a biasing voltage is not applied to the gate contact 30 and the drain contact 34 is positively biased, a junction between each deep well region 20 and the drift layer 14 is reverse biased, thereby placing the conventional power MOSFET 10 in an OFF state. In the OFF state of the conventional power MOSFET 10, any voltage between the source and drain contact is supported by the drift layer 14. Due to the vertical structure of the conventional power MOSFET 10, large voltages may be placed between the source contacts 32 and the drain contact 34 without damaging the device.

FIG. 2 shows operation of the conventional power MOSFET 10 when the device is in an ON state. When a positive bias is applied to the gate contact 30 of the conventional power MOSFET 10, an inversion layer channel 36 is formed at the surface of the drift layer 14 underneath the gate contact 30, thereby placing the conventional power MOSFET 10 in an ON state. In the ON state of the conventional power MOSFET 10, current (shown by the shaded region in FIG. 2) is allowed to flow from each one of the source contacts 32 through the inversion layer channel 36 and into the JFET region 18 of the drift layer 14. Once in the JFET region 18, current flows downward through the drift layer 14 towards the drain contact 34. An electric field presented by junctions formed between the deep well region 20, the base region 22, and the drift layer 14 constricts current flow in the JFET region 18 into a JFET channel 38 having a JFET channel width 40. At a certain spreading distance 42 from the inversion layer channel 36 when the electric field presented by the junction implants 16 is diminished, the flow of current is distributed laterally, or spread out in the drift layer 14, as shown in FIG. 2. The JFET channel width 40 and the spreading distance 42 determine the internal resistance of the power MOSFET 10, thereby dictating the performance of the device. A conventional power MOSFET 10 generally requires a channel width 26 of 3 microns or wider in order to sustain an adequate JFET channel width and 40 spreading distance 42 for proper operation of the device.

The electric field formed by the junctions between the deep well region 20, the base region 22, and the drift layer 14 radiates through the gate oxide layer 28, thereby physically degrading the gate oxide layer 28 over time. Eventually, the electric field will cause the gate oxide layer 28 to break down, and the conventional power MOSFET 10 will cease to function.

Accordingly, a power MOSFET is needed that is capable of handling high voltages in the OFF state while maintaining a low ON state resistance and having an improved longevity.

SUMMARY

The present disclosure relates to a transistor device including a substrate, a drift layer over the substrate, and a spreading layer over the drift layer. The spreading layer includes a pair of junction implants separated by a junction gate field effect (JFET) region. Each one of the junction implants may include a deep well region, a base region, and a source region. The transistor device further includes a gate oxide layer, a gate contact, a pair of source contacts, and a drain contact. The gate oxide layer is on a portion of the spreading layer such that the gate oxide layer partially overlaps and runs between each source region of each junction implant. The gate contact is on top of the gate oxide layer. Each one of the source contacts are on a portion of the spreading layer such that each source contact partially overlaps both the source region and the deep well region of each junction implant, respectively. The drain contact is on the surface of the substrate opposite the drift layer.

According to one embodiment, the spreading layer has a graded doping profile, such that the doping concentration of the spreading layer decreases in proportion to the distance of the point in the spreading layer from the JFET region.

According to an additional embodiment, the spreading layer includes multiple layers, each having a different doping concentration that progressively decreases in proportion to the distance of the layer from the JFET region.

By placing a spreading layer over the drift layer, the space between each junction implant, or length of the JFET region, can be reduced while simultaneously maintaining or reducing the ON resistance of the device. By reducing the space between each junction implant, a larger portion of the electric field generated during reverse bias of the transistor device is terminated by each one of the junction implants, thereby reducing the electric field seen by the gate oxide layer and increasing the longevity of the device.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
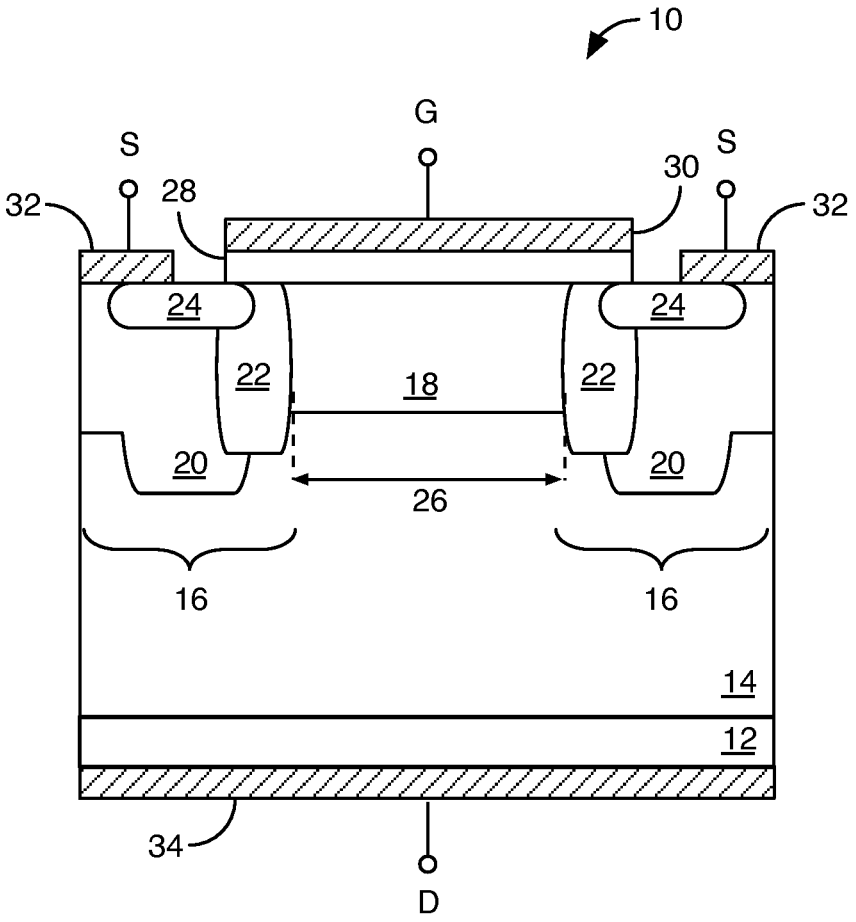
FIG. 1 (RELATED ART)
FIG. 1 shows a schematic representation of a conventional power MOSFET device.
Figure 2:
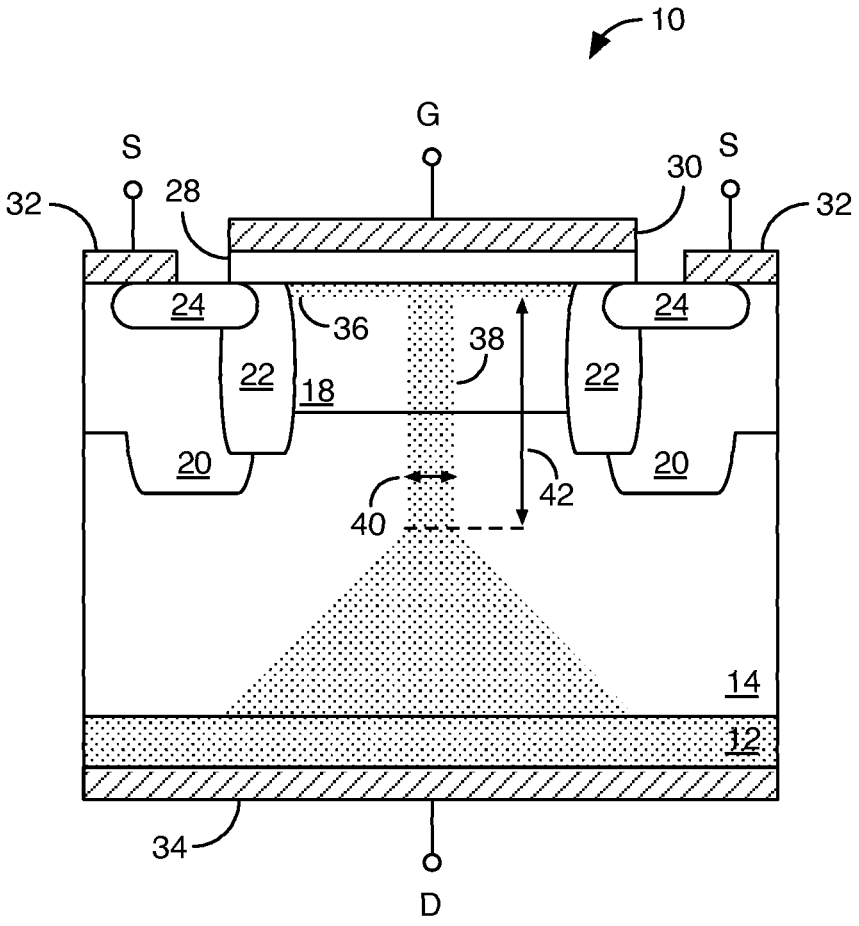
FIG. 2 (RELATED ART)
FIG. 2 shows details of the operation of the conventional power MOSFET device shown in FIG. 1.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
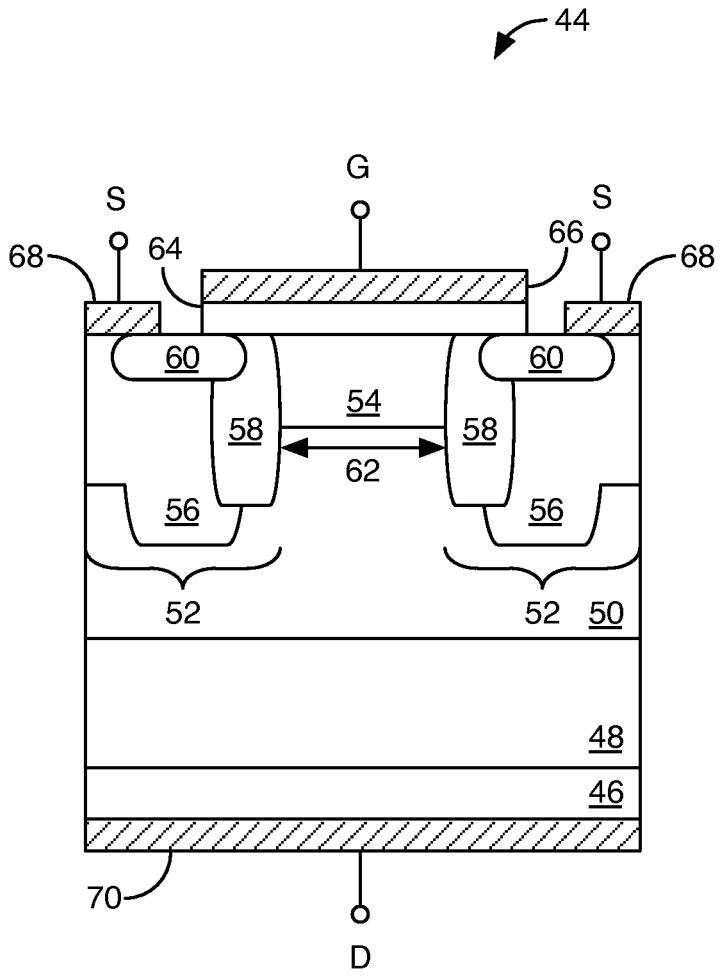
FIG. 3 shows a power MOSFET device according to one embodiment of the present disclosure.

Turning now to FIG. 3, a power MOSFET device 44 is shown according to one embodiment of the present disclosure. The power MOSFET device 44 includes a substrate 46, a drift layer 48 formed over the substrate 46, a spreading layer 50 formed over the drift layer 48, one or more junction implants 52 in the surface of the spreading layer 50 opposite the drift layer 48, and a junction gate field effect transistor (JFET) region 54 between each one of the junction implants 52. Each one of the junction implants 52 may be formed by an ion implantation process, and may include a deep well region 56, a base region 58, and a source region 60. Each deep well region 56 extends from a corner of the spreading layer 50 opposite the drift layer 48 downwards towards the drift layer 48 and inwards towards the center of the spreading layer 50. The deep well region 56 may be formed uniformly or include one or more protruding regions. Each base region 58 is formed vertically from the surface of the spreading layer 50 opposite the drift layer 48 downwards towards the drift layer 48 along a portion of the inner edge of each one of the deep well regions 56. Each source region 60 is formed in a shallow portion on the surface of the spreading layer 50 opposite the drift layer 48, and extends laterally to overlap a portion of the deep well region 56 and the base region 58, without extending over either. The JFET region 54 defines a channel width 62 between each one of the junction implants 52.

A gate oxide layer 64 is positioned on the surface of the spreading layer 50 opposite the drift layer 48, and extends laterally between a portion of the surface of each source region 60, such that the gate oxide layer 64 partially overlaps and runs between the surface of each source region 60 in the junction implants 52. A gate contact 66 is positioned on top of the gate oxide layer 64. Two source contacts 68 are each positioned on the surface of the spreading layer 50 opposite the drift layer 48 such that each one of the source contacts 68 partially overlaps both the source region 60 and the deep well region 56 of the junction implants 52, respectively, and does not contact the gate oxide layer 64 or the gate contact 66. A drain contact 70 is located on the surface of the substrate 46 opposite the drift layer 48.

In operation, when a biasing voltage is not applied to the gate contact 66 and the drain contact 70 is positively biased, a junction between each deep well region 56 and the spreading layer 50 is reverse biased, thereby placing the power MOSFET 44 in an OFF state. In an OFF state of the power MOSFET 44, any voltage between the source and drain contact is supported by the drift layer 48 and the spreading layer 50. Due to the vertical structure of the power MOSFET 44, large voltages may be placed between the source contacts 68 and the drain contact 70 without damaging the device.

Figure 4:
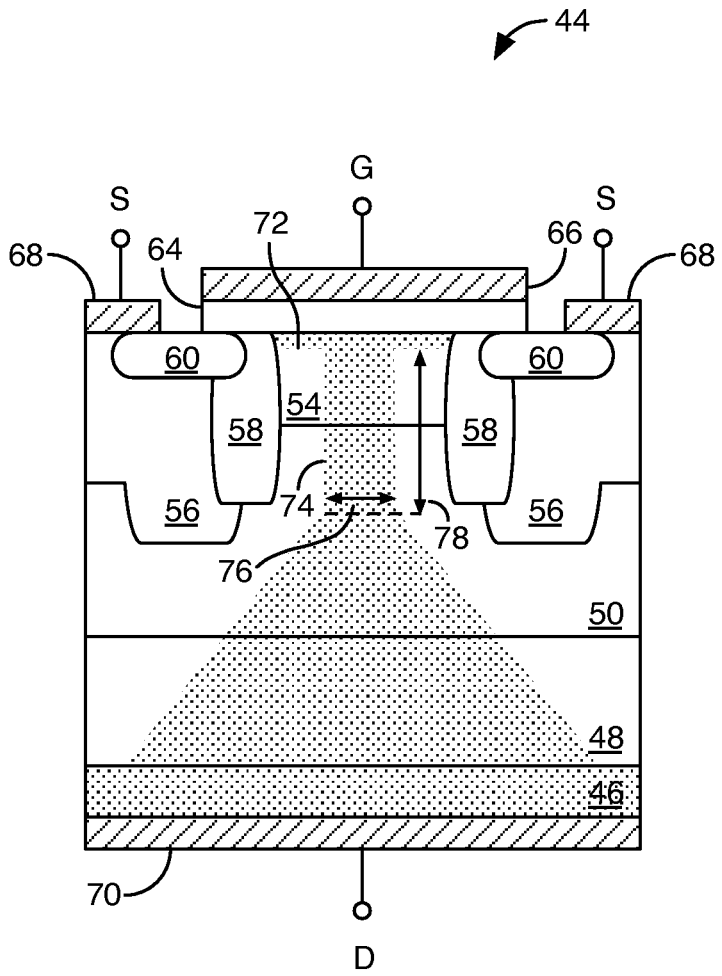
FIG. 4 shows details of the operation of the power MOSFET device shown in FIG. 3 according to one embodiment of the present disclosure.

FIG. 4 shows the operation of the power MOSFET 44 when the device is in an ON state. When a positive bias is applied to the gate contact 66 of the power MOSFET 44, an inversion layer channel 72 is formed at the surface of the spreading layer 50 underneath the gate contact 66, thereby placing the power MOSFET 44 in an ON state. In the ON state of the power MOSFET 44, current (shown by the shaded region in FIG. 4) is allowed to flow from each one of the source contacts 68 through the inversion layer channel 72 and into the JFET region 54. Once in the JFET region 54, current flows downward through the spreading layer 50 towards the drain contact 70. An electric field presented by the junctions formed between the deep well region 56, the base region 58, and the spreading layer 50 constricts current flow in the JFET region 54 into a JFET channel 74 having a JFET channel width 76.

At a certain spreading distance 78 from the inversion layer channel 72 when the electric field presented by the junction implants 52 is diminished, the flow of current is distributed laterally, or spread out, in the spreading layer 50, as shown in FIG. 4. The spreading layer 50 is doped in such a way to decrease resistance in the spreading layer 50, thereby mitigating the effects of the electric field by increasing the JFET channel width 76 and decreasing the spreading distance 78. By increasing the JFET channel width 76 and decreasing the spreading distance 78, the spreading layer 50 significantly reduces the ON resistance of the power MOSFET 44. For example, the ON resistance of the power MOSFET 44 may be about 2.2 $m\Omega/cm^2$ when the device is rated to handle 1200V and about 1.8 $m\Omega/cm^2$ when the device is rated to handle 600V.

By reducing the ON resistance of the power MOSFET 44, the spreading layer 50 allows for a reduction of the channel width 62 between each one of the junction implants 52. Reducing the channel width 62 of the power MOSFET 44 not only improves the footprint of the device, but also the longevity. As each one of the junction implants 52 is moved closer to one another, a larger portion of the electric field generated by the junctions between the deep well region 56, the base region 58, and the spreading layer 50 is terminated by the opposite junction implant 52. Accordingly, the electric field seen by the gate oxide layer 64 is significantly reduced, thereby resulting in improved longevity of the power MOSFET 44. According to one embodiment, the channel width 62 of the power MOSFET 44 is less than 3 microns.

The power MOSFET 44 may be, for example, a silicon carbide (SiC), gallium arsenide (GaAs), or gallium nitride (GaN) device. Those of ordinary skill in the art will appreciate that the concepts of the present disclosure may be applied to any materials system. The substrate 46 of the power MOSFET 44 may be about 180-350 microns thick. The drift layer 48 may be about 3.5-12 microns thick, depending upon the voltage rating of the power MOSFET 44. The spreading layer 50 may be about 1.0-2.5 microns thick. Each one of the junction implants 52 may be about 1.0-2.0 microns thick. The JFET region 54 may be about 0.75-1.5 microns thick.

According to one embodiment, the spreading layer 50 is an N-doped layer with a doping concentration from about $2\times10^{17}$ $cm^{-3}$ to $5\times10^{16}$ $cm^{-3}$. The spreading layer 50 may be graded, such that the portion of the spreading layer 50 closest to the drift layer 48 has a doping concentration about $5\times10^{16}$ $cm^{-3}$ that is graduated as the spreading layer 50 extends upwards to a doping concentration of about $2\times10^{17}$ $cm^{-3}$. According to an additional embodiment, the spreading layer 50 may comprise multiple layers. The layer of the spreading layer 50 closest to the drift layer 48 may have a doping concentration about $5\times10^{16}$ $cm^{-3}$. The doping concentration of each additional layer in the spreading layer may [decrease] *increase* in proportion to the distance of the layer from the JFET region 54. The layer of the spreading layer 50 closest to the [drift layer 48] *JFET region 54* may have a doping concentration about $2\times10^{17}$ $cm^{-3}$.

The JFET region 54 may be an N-doped layer with a doping concentration from about $1\times10^{16}$ $cm^{-3}$ to $2\times10^{17}$ $cm^{-3}$. The drift layer 48 may be an N-doped layer with a doping concentration from about $6\times10^{15}$ $cm^{-3}$ to $1.5\times10^{16}$ $cm^{-3}$. The deep well region 56 may be a heavily P-doped region with a doping concentration from about $5\times10^{17}$ $cm^{-3}$ to $1\times10^{20}$ $cm^{-3}$. The base region 58 may be a P-doped region with a doping concentration from about $5\times10^{16}$ $cm^{-3}$ to $1\times10^{19}$ $cm^{-3}$. The source region 60 may be an N-doped region with a doping concentration from about $1\times10^{19}$ $cm^{-3}$ to $1\times10^{21}$ $cm^{-3}$. The N doping agent may be nitrogen, phosphorous, or any other suitable element, as will be appreciated by those of ordinary skill in the art. The P doping agent may be aluminum, boron, or any other suitable element, as will be appreciated by those of ordinary skill in the art.

The gate contact 66, the source contacts 68, and the drain contact 70 may be comprised of multiple layers. For example, each one of the contacts may include a first layer of nickel or nickel-aluminum, a second layer of titanium over the first layer, a third layer of titanium-nickel over the second layer, and a fourth layer of aluminum over the third layer. Those of ordinary skill in the art will appreciate that the gate contact 66, the source contacts 68, and the drain contact 70 may be formed of any suitable material.

Figure 5:
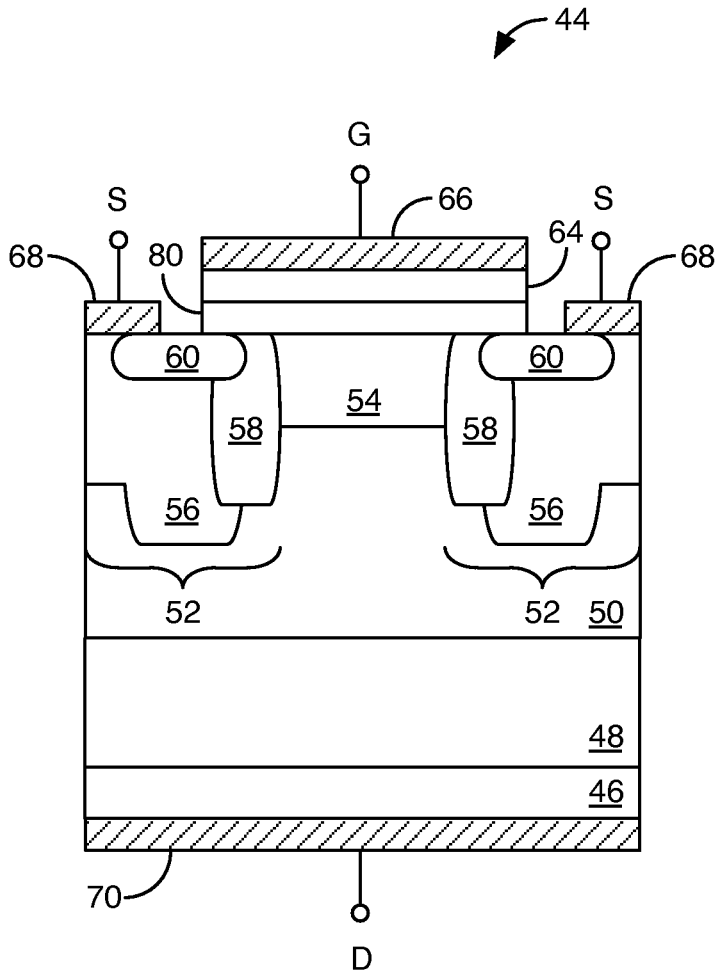
FIG. 5 shows an alternative embodiment of the power MOSFET device shown in FIG. 3.
Figure 6:
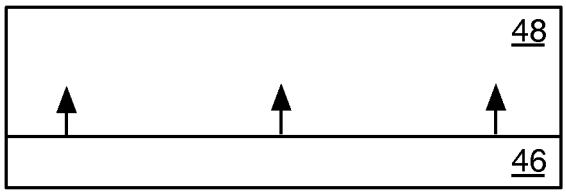
FIGS. 6-15 illustrate a process for manufacturing the power MOSFET device shown in FIG. 3.

FIG. 5 shows the power MOSFET 44 according to an additional embodiment of the present disclosure. The power MOSFET 44 shown in FIG. 5 is substantially similar to that of FIG. 3, but further includes a channel Re-growth layer 80 between the gate oxide layer 64 and the spreading layer 50. The channel re-growth layer 80 is provided to lower the threshold voltage of the power MOSFET 44. Specifically, the deep well region 56, due to a heavy level of doping, may raise the threshold voltage of the power MOSFET 44 to a level that inhibits optimum performance. Accordingly, the channel re-growth layer 80 may offset the effects of the deep well region 56 in order to lower the threshold voltage of the power MOSFET 44. The channel re-growth layer 80 may be an N-doped region with a doping concentration from about $1\times10^{15}$ $cm^{-3}$ to $1\times10^{17}$ $cm^{-3}$ FIGS. 6-15 illustrate a process for manufacturing the power MOSFET 44 shown in FIG. 3. First, as illustrated by FIG. 6, the drift layer 48 is grown on top of the substrate 46. Those of ordinary skill in the art will recognize that any suitable growth process may be used to produce the drift layer 48 without departing from the principles of the present disclosure. For example, a chemical vapor deposition process may be used to form the drift layer 48.

Figure 7:
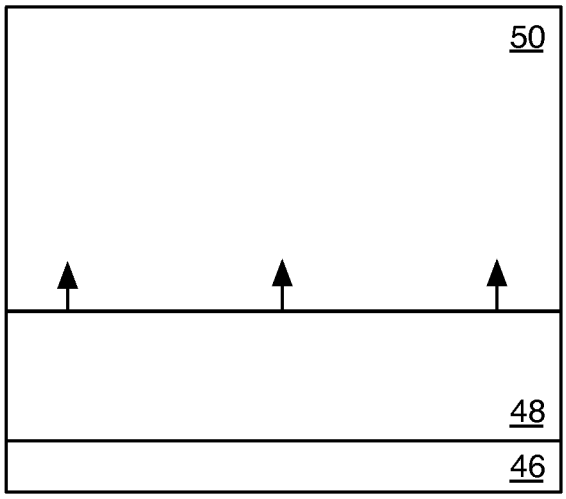

Next, as illustrated by FIG. 7, the spreading layer 50 is grown on top of the drift layer 48. As discussed above, any suitable growth process may be used to create the spreading layer 50 without departing from the principles of the present disclosure. According to one embodiment, the spreading layer 50 is grown such that it includes a graded doping profile.

Figure 8:
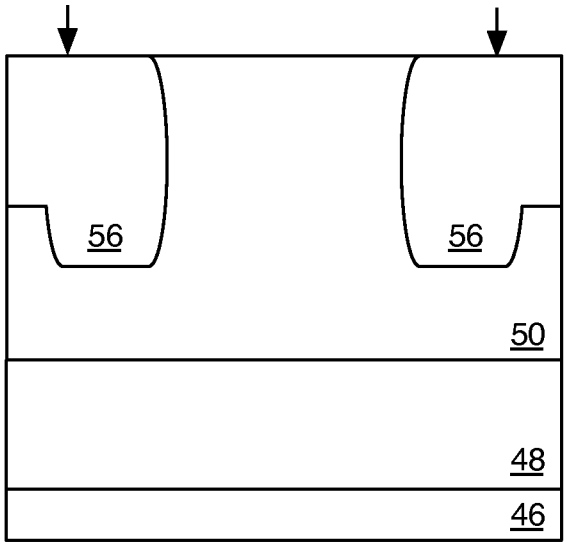
Figure 9:
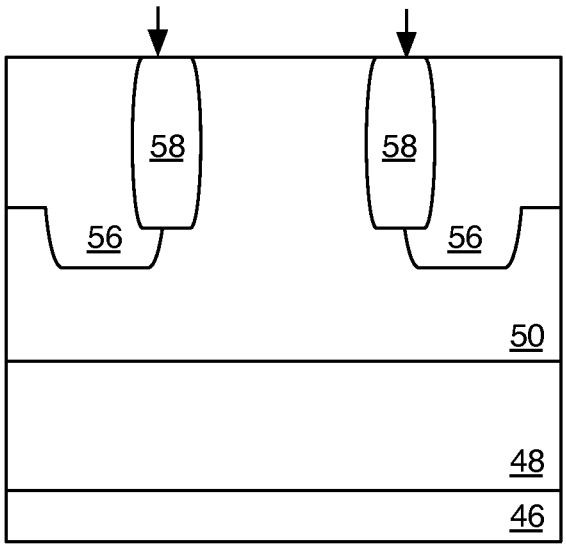
Figure 10:
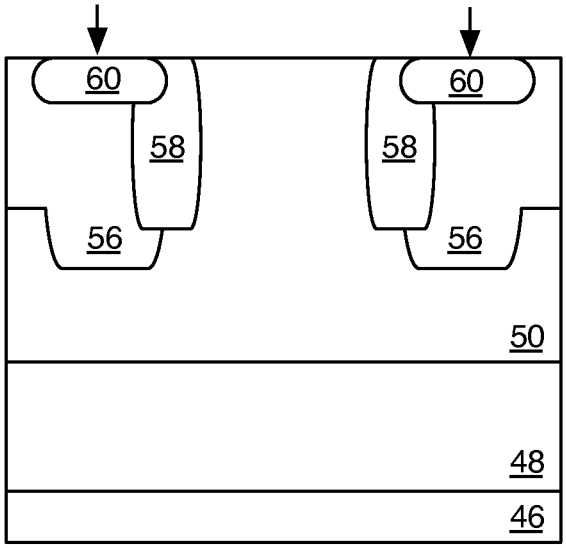

Next, as illustrated by FIG. 8, the deep well region 56 of each one of the junction implants 52 is implanted in the spreading layer 50. As will be appreciated by those of ordinary skill in the art, the deep well regions 56 may be implanted by any suitable implantation process. For example, an ion implantation process may be used to form the deep well regions 56. The base regions 58 are then implanted, as illustrated by FIG. 9, followed by the source regions 60, as illustrated by FIG. 10.

Figure 11:
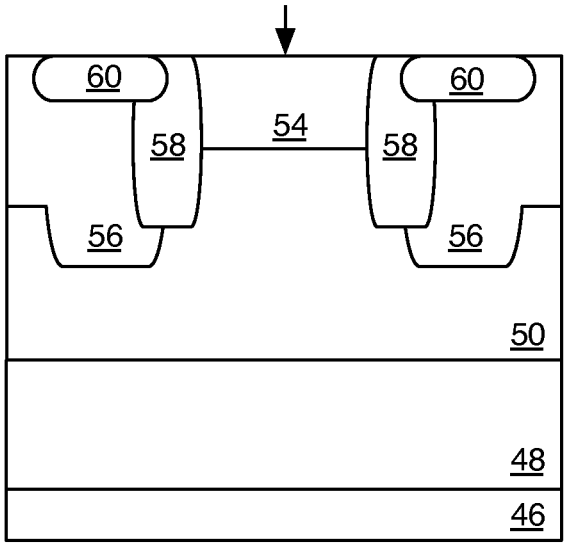

Next, as illustrated by FIG. 11, the JFET region 54 is implanted. As discussed above, any suitable implantation process may be used to create the JFET region 54 without departing from the principles of the present disclosure. Additionally, although not illustrated, the JFET region 54 may alternatively be created by a growth process.

Figure 12:
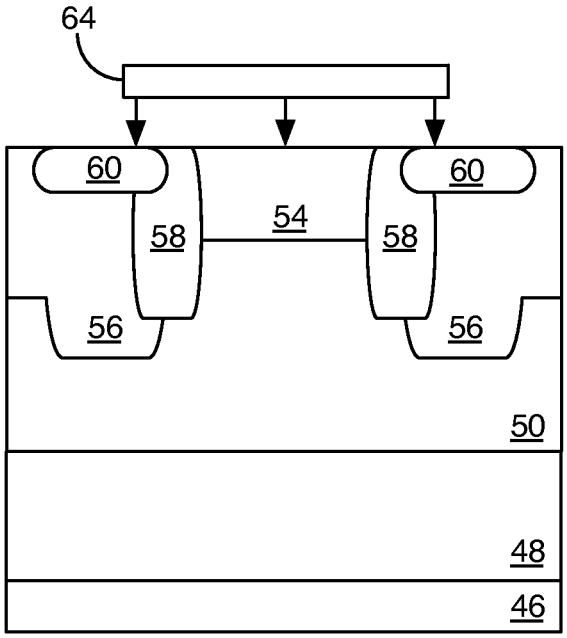
Figure 13:
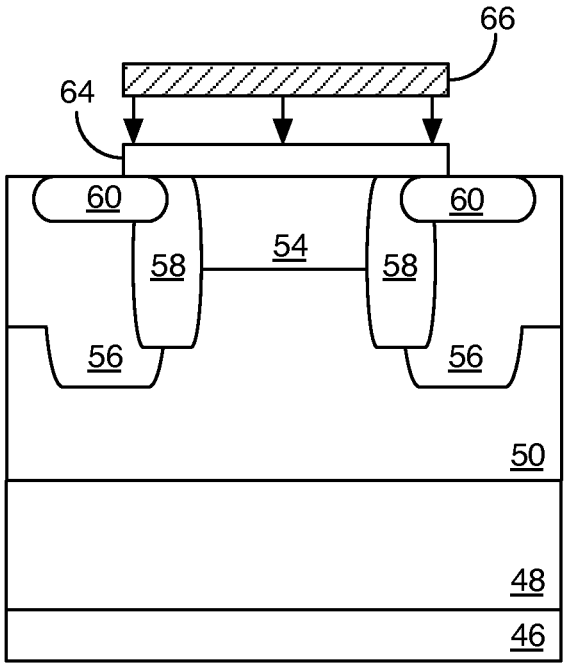
Figure 14:
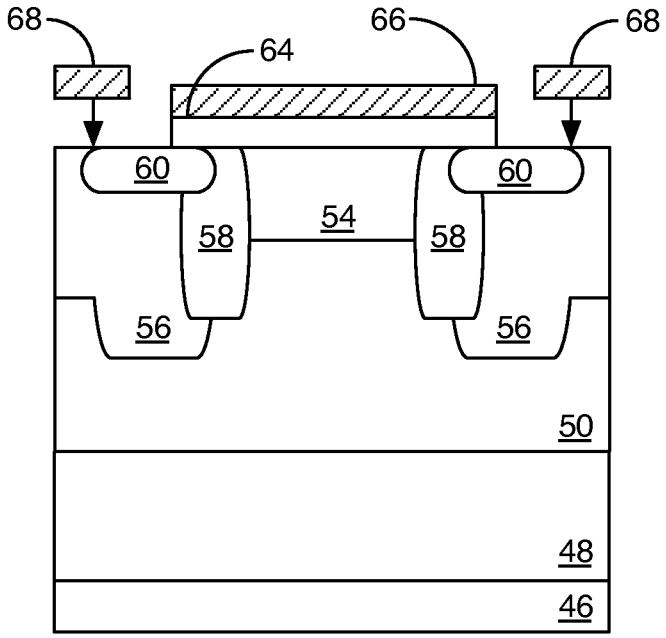
Figure 15:
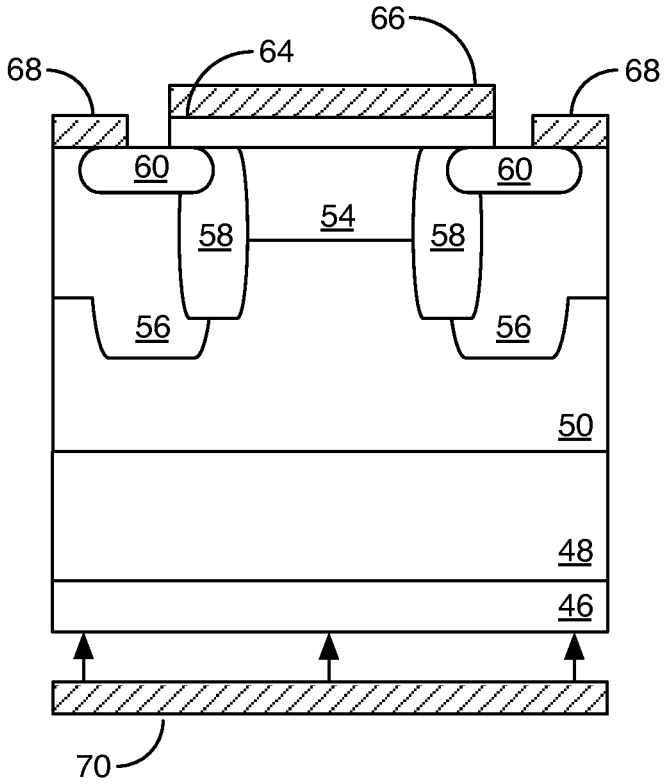

Next, as illustrated by FIG. 12, the gate oxide layer 64 is formed on top of the spreading layer 50, such that the gate oxide layer 64 partially overlaps and runs between the surface of each source region 60 in the junction implants 52. In FIG. 13, the gate contact 66 is formed on top of the gate oxide layer 64. The source contacts 68 are then formed on the surface of the spreading layer 50 such that each one of the source contacts 68 partially overlaps both the source region 60 and the deep well region 56 of the junction implants 52, respectively, and does not contact the gate oxide layer 64 or the gate contact 66, as illustrated by FIG. 14. Finally, in FIG. 15, the drain contact 70 is provided on the surface of the substrate 46 opposite the drift layer 48.

Figure 16:
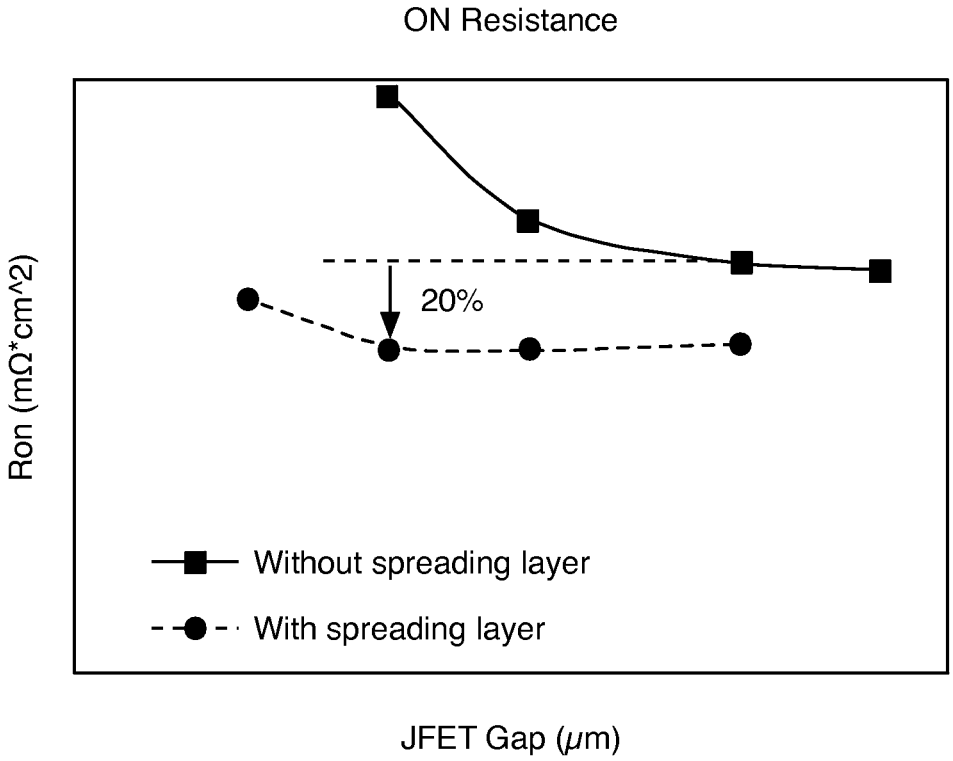
FIG. 16 shows a graph indicating performance improvements achieved by the power MOSFET device shown in FIG. 3.

FIG. 16 is a chart depicting the effect of the spreading layer 50 on the ON resistance of the power MOSFET 44. As shown, the spreading layer provides about a 20% decrease in the ON resistance of the device.

Figure 17:
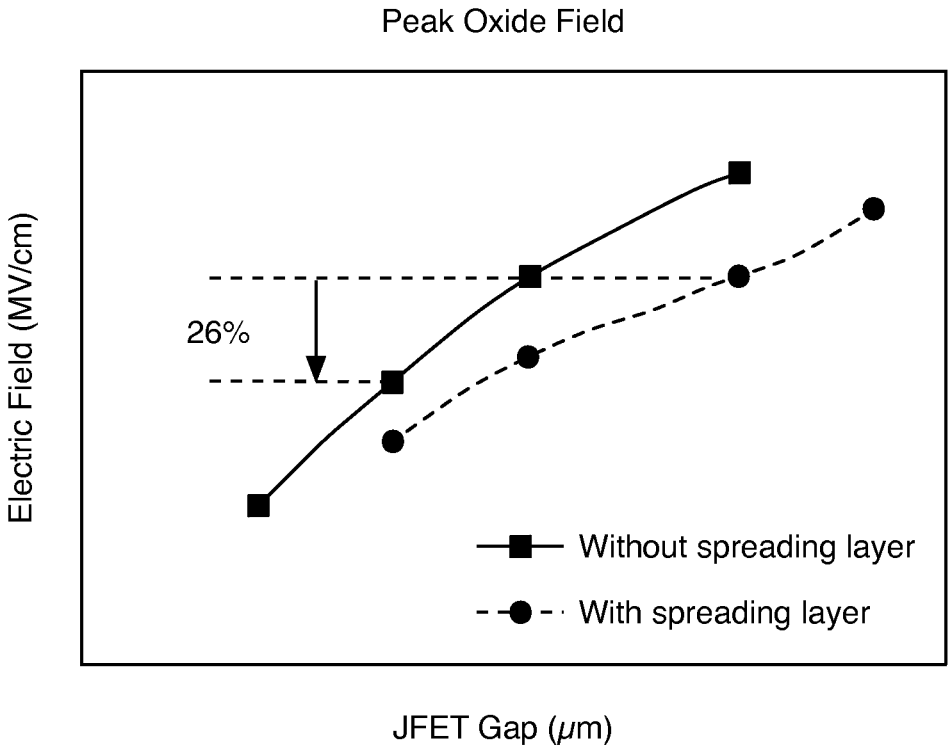
FIG. 17 shows a graph indicating longevity improvements achieved by the power MOSFET device shown in FIG. 3.

FIG. 17 is a chart depicting the effect of the spreading layer 50 on the electric field seen by the gate oxide layer 64. Because the spreading layer 50 allows a reduction in channel width 62 without impeding the performance of the power MOSFET 44, up to 26% of the electric field seen by the gate oxide layer 64 may be terminated by the opposing junction implants 52, thereby significantly increasing the longevity of the device.

Those skilled in the art will recognize improvements and modifications to the preferred embodiments of the present disclosure. All such improvements and modifications are considered within the scope of the concepts disclosed herein and the claims that follow.

What is claimed is:

[1. A transistor device comprising a gate, a source, and a drain, wherein the gate and the source are separated from the drain by at least a JFET region, a spreading layer including a graded doping profile, and a drift layer, wherein a doping concentration of the spreading layer varies more than a factor of about $10^2$ $cm^{-3}$ between the JFET region and the drift layer.]

[2. The transistor device of claim 1 wherein the JFET region, the spreading layer, and the drift layer comprise silicon carbide.]

[3. The transistor device of claim 1 wherein the transistor device is a vertically disposed metal-oxide-semiconductor field-effect transistor (MOSFET).]

[4. The transistor device of claim 1 wherein the JFET region has a first doping concentration, the spreading layer has a second doping concentration that is different from the first doping concentration, and the drift layer has a third doping concentration that is different from the first doping concentration and the second doping concentration.]

[5. The transistor device of claim 4 wherein the spreading layer has a doping concentration in the range of approximately $2\times10^{17}$ $cm^{-3}$ to approximately $5\times10^{16}$ $cm^{-3}$.]

[6. The transistor device of claim 4 wherein the JFET region has a doping concentration in the range of approximately $1\times10^{16}$ $cm^{-3}$ to approximately $2\times10^{17}$ $cm^{-3}$.]

[7. The transistor device of claim 1 wherein a thickness of the JFET region is in the range of approximately 0.75 microns to approximately 1 micron.]

[8. The transistor device of claim 1 wherein a thickness of the spreading layer is in the range of approximately 1.0 microns to approximately 2.5 microns.]

[9. The transistor device of claim 1 wherein a thickness of the drift layer is in the range of approximately 3.5 microns to approximately 12 microns.]

[10. The transistor device of claim 1 wherein an internal resistance of the transistor device is less than approximately 2.2 $m\Omega/cm^2$.]

[11. The transistor device of claim 1 wherein the transistor device is adapted to support a voltage between the source and the drain of at least 600V while in an OFF state, and further wherein the transistor device has an internal resistance of less than approximately 1.8 $m\Omega/cm^2$. ]

[12. The transistor device of claim 1 wherein the transistor device is adapted to support a voltage between the source and the drain of at least 1200V while in an OFF state, and further wherein the transistor device has an internal resistance of less than approximately 2.2 mΩ/cm$^2$. ]

[13. A transistor device comprising:

a substrate;

a drift layer on the substrate;

a spreading layer on the drift layer, the spreading layer having a graded doping profile such that a doping concentration of the spreading layer varies more than a factor of about $10^2$ cm$^{-3}$ between a JFET region and the drift layer;

a pair of junction implants in the spreading layer and separated by the JFET region, each one of the pair of junction implants comprising a deep well region, a base region, and a source region;

a gate contact and a source contact on the spreading layer, such that the gate contact partially overlaps and runs between each source region in the pair of junction implants; and a drain contact on the substrate opposite the drift layer.]

[14. The transistor device of claim 13 further comprising a gate oxide layer between the gate contact and the spreading layer.]

[15. The transistor device of claim 13 wherein the source contact is divided into two sections, and each section of the source contact is on a portion of the spreading layer such that each section of the source contact partially overlaps both the source region and the deep well region of each one of the pair of junction implants, respectively.]

[16. The transistor device of claim 13 wherein the transistor device is a vertically disposed metal-oxide-semiconductor field-effect transistor (MOSFET).]

[17. The transistor device of claim 13 wherein the drift layer and the spreading layer comprise silicon carbide.]

[18. The transistor device of claim 13 wherein a width of the JFET region is approximately 3 microns or less.]

[19. The transistor device of claim 18 wherein an internal resistance of the transistor device is less than approximately 2.2 mΩ/cm$^2$. ]

[20. The transistor device of claim 13 wherein the transistor device is adapted to support a voltage between the source contact and the drain contact of at least 600V while in an OFF state, and further wherein the transistor device has an internal resistance of less than approximately 1.8 mΩ/cm$^2$.]

[21. The transistor device of claim 13 wherein the transistor device is adapted to support a voltage between the source contact and the drain contact of at least 1200V while in an OFF state, and further wherein the transistor device has an internal resistance of less than approximately 2.2 mΩ/cm$^2$.]

[22. The transistor device of claim 13 wherein a thickness of the drift layer is in the range of approximately 3.5 microns to approximately 12 microns.]

[23. The transistor device of claim 13 wherein a thickness of the spreading layer is in the range of approximately 1.0 microns to approximately 2.5 microns.]

[24. The transistor device of claim 13 wherein a thickness of the JFET region is in the range of approximately 0.75 microns to approximately 1.0 microns.]

[25. The transistor device of claim 13 wherein a thickness of each one of the pair of junction implants is in the range of approximately 1.0 microns to approximately 2.0 microns.]

*26. A transistor device comprising:*

*a substrate;*

*a drift layer on the substrate;*

*a spreading layer on the drift layer, the spreading layer comprising a first doping type;*

*a pair of junction implants that are provided to a first depth in the spreading layer, wherein each of the junction implants in the pair of junction implants comprises:*

*a well region with a second doping type that is opposite the first doping type; and*

*a base region with the second doping type;*

*wherein the well region is provided to the first depth in the spreading layer, and the base region is provided to a second depth in the spreading layer that is less than the first depth; and*

*a JFET region that is provided to a third depth in the spreading layer that is less than the first depth and less than the second depth;*

*wherein a thickness of the spreading layer is in a range from 1.0 to 2.5 microns and is provided at a fourth depth that is greater than the first depth, and*

*wherein a thickness of the JFET region is in a range from 0.75 to 1.5 microns.*

*27. The transistor device of claim 26, wherein the transistor device comprises silicon carbide.*

*28. The transistor device of claim 26, further comprising a gate contact, a drain contact, and a source contact.*

*29. The transistor device of claim 28, wherein the transistor device is a vertically disposed metal-oxide-semiconductor field-effect transistor (MOSFET).*

*30. The transistor device of claim 28, further comprising a channel regrowth layer between the gate contact and the JFET region, the channel regrowth layer comprising the first doping type with a doping concentration that is less than a doping concentration of the JFET region.*

*31. The transistor device of claim 30, wherein the doping concentration of the channel regrowth layer is less than a doping concentration of the spreading layer at an interface between the spreading layer and the drift layer.*

*32. The transistor device of claim 31, wherein the spreading layer has a doping concentration in a range from $2\times10^{17}$ cm$^{-3}$ to $5\times10^{16}$ cm$^{-3}$ and the channel regrowth layer has the doping concentration in a range from $1\times10^{15}$ cm$^{-3}$ to $1\times10^{17}$ cm$^{-3}$.*

*33. The transistor device of claim 26, wherein a channel width of the transistor device is less than 3 microns.*

*34. The transistor device of claim 33, wherein an on-state resistance of the transistor device is between 1.8 mΩ/cm$^2$ and 2.2 mΩ/cm$^2$, and a blocking voltage of the transistor device is rated to handle between 600 volts and 1200 volts.*

*35. The transistor device of claim 26, wherein a thickness of each of the junction implants in the pair of junction implants is in a range from 1.0 to 2.0 microns.*

*36. A transistor device comprising:*

*a substrate;*

*a drift layer on the substrate;*

*a spreading layer on the drift layer, the spreading layer comprising a first doping type;*

*a pair of junction implants that are provided to a first depth in the spreading layer, wherein each of the junction implants in the pair of junction implants comprises:*

*a well region with a second doping type that is opposite the first doping type; and*

*a base region with the second doping type;*

*wherein the well region is provided to the first depth in the spreading layer, and the base region is provided to a second depth in the spreading layer that is less than the first depth; and*

*a JFET region that is provided to a third depth in the spreading layer that is less than the first depth and less than the second depth;*

*wherein a thickness of the spreading layer is provided at a fourth depth that is greater than the first depth, and a doping concentration of the spreading layer increases as a distance from the drift layer increases such that a ratio of the doping concentration at an interface between the spreading layer and the drift layer to the doping concentration at the third depth is 1:x where x is greater than or equal to 2 and less than or equal to 4, and*

*wherein a width of the spreading layer at the second depth and between the base region of each of the junction implants in the pair of junction implants is less than a width of the spreading layer at the first depth and between the well region of each of the junction implants in the pair of junction implants.*

*37. A transistor device comprising:*

*a substrate;*

*a drift layer on the substrate;*

*a spreading layer on the drift layer, the spreading layer comprising a first doping type;*

*a pair of junction implants that are provided to a first depth in the spreading layer, wherein each of the junction implants in the pair of junction implants comprises:*

*a well region with a second doping type that is opposite the first doping type; and*

*a base region with the second doping type;*

*wherein the well region is provided to the first depth in the spreading layer, and the base region is provided to a second depth in the spreading layer that is less than the first depth; and*

*a JFET region that is provided to a third depth in the spreading layer that is less than the first depth and less than the second depth;*

*wherein a thickness of the spreading layer is provided at a fourth depth that is greater than the first depth, and a doping concentration of the spreading layer increases as a distance from the drift layer increases such that a ratio of the doping concentration at an interface between the spreading layer and the drift layer to the doping concentration at the third depth is 1:x where x is greater than or equal to 2 and less than or equal to 4, and*

*wherein the doping concentration of the spreading layer at the third depth is greater than or equal to a doping concentration of the JFET region.*

*38. A transistor device comprising:*

*a substrate;*

*a drift layer on the substrate;*

*a spreading layer on the drift layer, the spreading layer comprising a first doping type;*

*a pair of junction implants that are provided to a first depth in the spreading layer, wherein each of the junction implants in the pair of junction implants comprises:*

*a well region with a second doping type that is opposite the first doping type; and*

*a base region with the second doping type;*

*wherein the well region is provided to the first depth in the spreading layer, and the base region is provided to a second depth in the spreading layer that is less than the first depth; and*

*a JFET region that is provided to a third depth in the spreading layer that is less than the first depth and less than the second depth;*

*wherein a thickness of the spreading layer is provided at a fourth depth that is greater than the first depth, and a doping concentration of the spreading layer increases as a distance from the drift layer increases such that a ratio of the doping concentration at an interface between the spreading layer and the drift layer to the doping concentration at the third depth is 1:x where x is greater than or equal to 2 and less than or equal to 4, and*

*wherein the base region of each of the junction implants in the pair of junction implants is positioned between the respective well region of the respective junction implants in the pair of junction implants and the JFET region.*

* * * * *